United States Patent
Tseng et al.

(10) Patent No.: US 7,015,523 B2
(45) Date of Patent: Mar. 21, 2006

(54) FERROELECTRIC MEMORY STRUCTURE AND FABRICATION METHOD THEREOF

(75) Inventors: Tseung-Yuen Tseng, Sin Jhu (TW); Shean Yiah Lee, Taninan (TW)

(73) Assignee: National Chiao-Tung University, Hsinchu (TW)

(*) Notice: Subject to any disclaimer, the term of this patent is extended or adjusted under 35 U.S.C. 154(b) by 10 days.

(21) Appl. No.: 10/758,628

(22) Filed: Jan. 15, 2004

(65) Prior Publication Data

US 2004/0145003 A1    Jul. 29, 2004

(30) Foreign Application Priority Data

Jan. 20, 2003  (TW)  ................ 92101164 A

(51) Int. Cl.
*H01L 29/76*  (2006.01)
*H01L 29/94*  (2006.01)
*H01L 31/062*  (2006.01)
*H01L 31/113*  (2006.01)
*H01L 31/119*  (2006.01)

(52) U.S. Cl. ............. 257/295; 257/288; 257/310
(58) Field of Classification Search .......... 257/288, 257/295, 310
See application file for complete search history.

(56) References Cited

U.S. PATENT DOCUMENTS

| 6,285,577 B1 | 9/2001 | Nakamura |
| 6,449,185 B1 | 9/2002 | Kato et al. |
| 2004/0099893 A1* | 5/2004 | Martin et al. ............ 257/295 |

* cited by examiner

*Primary Examiner*—Long Pham
(74) *Attorney, Agent, or Firm*—Volpe and Koenig, P.C.

(57) ABSTRACT

A ferroelectric memory structure is disclosed. The ferroelectric memory structure includes a substrate, an insulating layer formed on the substrate, a plurality of oxide electrodes formed on the insulating layer, a ferroelectric layer formed on the insulating layer and the plurality of oxide electrodes, and a plurality of metallic electrodes formed on the ferroelectric layer and corresponding to the plurality of the oxide electrodes.

9 Claims, 4 Drawing Sheets

FERROELECTRIC MEMORY STRUCTURE AND FABRICATION METHOD THEREOF

FIELD OF THE INVENTION

This invention relates to a metal-ferroelectric-metal-insulator-semiconductor (MFMIS) structure and a method for fabricating the structure, and more particularly to a metal-ferroelectric-metal-insulator-semiconductor (MFMIS) structure and a fabrication method thereof for extending the memory retention time.

BACKGROUND OF THE INVENTION

In recent years, the ferroelectric memory field-effect transistor (FEMFET) is widely applied to the non-volatile ferroelectric random access memory (NVFeRAM) since the ferroelectric memory field-effect transistor is capable of nondestructively reading and raising the integration of components. The wide memory window and fast read/write abilities have been researched and disclosed. However, in U.S. Pat. Nos. 6,449,185 and 6,285,577, the memory retention time of the ferroelectric memory field-effect transistor is less than $10^5$ seconds, even few seconds, and the crystallization temperature of the ferroelectric thin film has to be above 600° C. The low memory retention time and high crystallization temperature must be overcome for industrial applications.

In order to effectively extend the memory retention time, according to the theories, the followings should be carried out under low voltage operation.

(1) raising a ratio of remnant polarization (Pr) to polarization saturation (Ps);

(2) lowering the leakage current density of an insulating layer; and (3) lowering a ratio of a ferroelectric thin film area to an insulating film area in the metal-ferroelectric-metal-insulator-semiconductor (MFMIS) structure to obtain a better capacitance matching between MFM and MIS.

Therefore, it is an object of the present invention to provide a MgO doped BST thin film to be served as an insulating layer having thermal stability, low current leakage density and high dielectric constant, a $LaNiO_3$(LNO) to be served as a metal oxide electrode, and a $Bi_xLa_{4-x}Ti_3O_{12}$ (BLT) to be served as a ferroelectric material. The advantages of the present invention are not only to extend the memory retention time more than $10^6$ seconds ($A_F/A_I=\frac{1}{12}$ and $\frac{1}{16}$), but also to lower the fabrication temperature of BLT ferroelectric thin film due to forming a ferroelectric film on the LNO oxide.

SUMMARY OF THE INVENTION

It is an aspect of the present invention to provide a ferroelectric memory structure for extending the memory retention time.

In accordance with an aspect of the present invention, the ferroelectric memory structure includes a a substrate, an insulating layer formed on the substrate, a plurality of oxide electrodes formed on the insulating layer, a ferroelectric layer formed on the insulating layer and the plurality of oxide electrodes; and a plurality of metallic electrodes formed on the ferroelectric layer and corresponding to the plurality of the oxide electrodes.

Preferably, the substrate is a silicon substrate.

Preferably, the silicon substrate is a p-type silicon substrate or a n-type silicon substrate.

Preferably, the insulating layer is made of $Ba_xSr_{1-x}TiO_3$, wherein the x is in a range between 0.3 and 1.

Preferably, the insulating layer is doped with MgO.

Preferably, the plurality of oxide electrodes are made of $LaNiO_3$.

Preferably, the ferroelectric layer is made of $Bi_xLa_{4-x}Ti_3O_{12}$ wherein x is in a range between 0 and 1.

Preferably, the plurality of metallic electrodes are made of one of a noble metal selected from a group consisting of Pt, Ru and Ir, and an oxide electrode containing a perovskite structure and comprising one selected a group consisting of $LaNiO_3$, $SrRuO_3$, $BaRuO_3$ and $YBa_2Cu_3O_7$.

Preferably, the plurality of metallic electrodes respectively have a first electrode area, and the plurality of oxide electrodes respectively have a second electrode area, wherein a ratio of the first electrode area to the second electrode area is less than $\frac{1}{12}$.

It is another aspect of the present to provide a method for fabricating a ferroelectric memory structure capable of extending the memory retention time.

In accordance with the aspect of the present invention, the method includes steps of (a) providing a substrate, (b) forming an insulating layer on the substrate, (c) forming a plurality of oxide electrodes on the insulting layer, (d) forming a ferroelectric layer on the insulating layer and the plurality of oxide electrodes, and (e) forming a plurality of metallic electrodes on the ferroelectric layer corresponding to the plurality of oxide electrodes.

Preferably, the substrate is a silicon substrate.

Preferably, the silicon substrate is a p-type silicon substrate or a n-type silicon substrate.

Preferably, step (a) further includes pretreating the substrate in turn with an RCA cleaning and a nitrogenization method.

Preferably, the insulating layer is formed by a chemical vapor deposition.

Preferably, the insulating layer is formed by a metal-organic deposition.

Preferably, the insulating layer is formed by a physical vapor deposition.

Preferably, the physical vapor deposition further employs a first sputtering target.

Preferably, the first sputtering target is made of $Ba_xSr_{1-x}TiO_3$, wherein the x is in a range between 0.3 and 1.

Preferably, the $Ba_xSr_{1-x}TiO_3$ sputtering target is formed by mixing and calcining $BaCO_3$, $SrCO_3$ and $TiO_2$.

Preferably, the first sputtering target is further doped with MgO.

Preferably, step (c) further includes a step of forming an conducting oxide layer on the insulating layer and performing a lithography process on the oxide layer to form the plurality of oxide electrodes.

Preferably, the oxide layer is formed by a chemical vapor deposition, a metal-organic deposition or a physical vapor deposition.

Preferably, the physical vapor deposition further employs a second sputtering target.

Preferably, the second sputtering target is made of $LaNiO_3$.

Preferably, the $LaNiO_3$ sputtering target is formed by mixing and calcining $La_2O_3$ and $NiO_2$.

Preferably, the ferroelectric layer is formed by a physical vapor deposition, a chemical vapor deposition or a metal-organic deposition.

Preferably, the metal-organic deposition is performed through a solution.

Preferably, the solution is a $Bi_xLa_{4-x}Ti_3O_{12}$ solution, wherein the x in a range between 0 and 4.

Preferably, the solution includes acetic acid to be served as a solvent, and includes lanthanum acetate, bismuth acetate and tetra(isopropyl)titanate to be served as solutes.

Preferably, step (e) further includes a step of forming a metallic layer on the ferroelectric layer, and performing a lift-off process on the metallic layer to form the plurality of metallic electrodes, wherein the plurality of metallic electrodes respectively have a first electrode area, the plurality of oxide electrodes respectively have a second electrode area, and a ratio of the first electrode area to the second electrode area is less than $1/12$.

Preferably, the plurality of metallic electrodes are made of one of a noble metal selected from a group consisting of Pt, Ru and Ir, and an oxide electrode containing a perovskite structure and including one selected a group consisting of $LaNiO_3$, $SrRuO_3$, $BaRuO_3$ and $YBa_2Cu_3O_7$.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The invention is described more specifically with reference to the following embodiments. It is to be noted that the following descriptions of preferred embodiments of this invention are presented herein for the purpose of illustration and description only; it is not intended to be exhaustive or to be limited to the precise form disclosed.

First, a p-type or a n-type silicon substrate is cleaned by a standard RCA cleaning method, so that organics and impurities on the surface of the silicon substrate are removed. Then, the silicon substrate is nitrogenized, wherein $N_2O$ or $NH_3$ is introduced at high temperature, a SiON sacrificial layer having a thickness of 20 to 100 angstrom is formed on the surface of the silicon substrate in a furnace. Then, the SiON sacrificial layer is removed by being immersed in diluted HF solution.

Subsequently, the nitrogenized silicon substrate is placed into a radio-frequency sputtering chamber, and a sputtering target containing 1–10 mol % of MgO doped $Ba_xSr_{1-x}TiO_3$ (x=0.3~1) is placed therein to form an insulating layer on the silicon substrate. The conditions for preparing the $Ba_xSr_{1-x}TiO_3$ (x=0.3~1) sputtering target are illustrated as follows. Absolute alcohol is added into the powders-containing x mole of $BaCO_3$, (1–x) mole of $SrCO_3$, 1 mole of $TiO_2$ and 1–10 mol % of MgO to form a mixture, and the mixture is wetly ground for 48 to 72 hours. After the first grinding, the mixture is screened with a 325-meshed sieve, and calcined at 900° C. for 2 hours, wherein the temperature raising velocity is 10° C./min. After the second grinding and screening, the mixture is calcined at 1.350° C. for 4 hours, wherein the heating rate is 5° C./min.

Figure 1A:
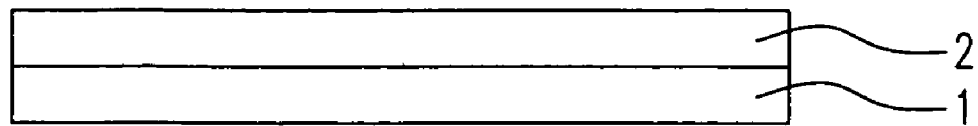
FIGS. 1(a)–(f) are schematical views showing the steps for fabricating a ferroelectric memory structure according to the present invention.

The silicon substrate deposited with the insulating layer MgO doped $(Ba_xSr_{1-x}TiO_3)$ with a thickness of 10 to 100 nm is annealed at 700° C. by a rapid thermal annealing process for 1 to 30 minutes, so that a crystalline insulating film 2 is formed on the silicon substrate 1 as shown in FIG. 1(a). The insulating film 2 has the features of high thermal stability, low leakage current density and high dielectric constant.

Figure 1B:
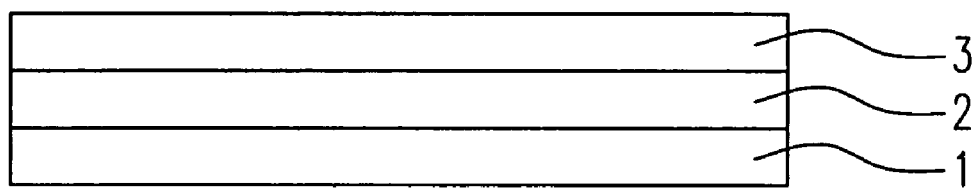

Afterward, the silicon substrate 1 plated with the insulating film 2 is placed in a radio-frequency sputtering chamber, and the LNO sputtering target is also placed therein. The LNO films are prepared at a fixed power of 100 W, substrate temperature of 300° C. and constant pressure of 20 mTorr, which is maintain by a mixture of Ar and $O_2$ at a mixing ratio of 1:1 with a total flow of 20 sccm. After sputtering, an oxide thin film 3 having good crystalline structure, a low resistivity and a thickness of 20 to 100 nm is formed on the insulating film 2 as shown in FIG. 1(b). The conditions for preparing the LNO sputtering target are illustrated as follows. 1 mole of $La_2O_3$ and 2 moles of $NiO_2$ are added into absolute alcohol to form a mixture, and the mixture is wetly ground for 24 to 48 hours. After the first grinding, the mixture is dried and screened with a 325-meshed sieve, and calcined at 600° C. for 1 hour with heating rate of 10° C./min. After second grinding and screening, the mixture is calcined at 1,000° C. for 3 hours.

Figure 1C:
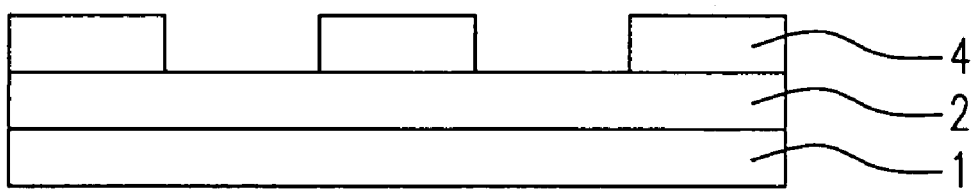

Subsequently, a lithography and an etching process are performed on the oxide thin film 3 to form a plurality of oxide electrodes (LNO) 4 on the insulating thin film 2 as shown in FIG. 1(c).

Subsequently, a solution is formed, wherein acetic acid is used as a solvent, and lanthanum acetate, bismuth acetate and tetra(isopropyl)-titanate are used as solutes. Then, 2 to 10 ml of ethylene glycol is added into the solution for lowering down the crystallization temperature, and the resulting solution is stirred at 90 to 150° C. for 120 minutes to form 20 ml of 0.2 M $Bi_xLa_{4-x}Ti_3O_{12}$ solution.

Figure 1D:
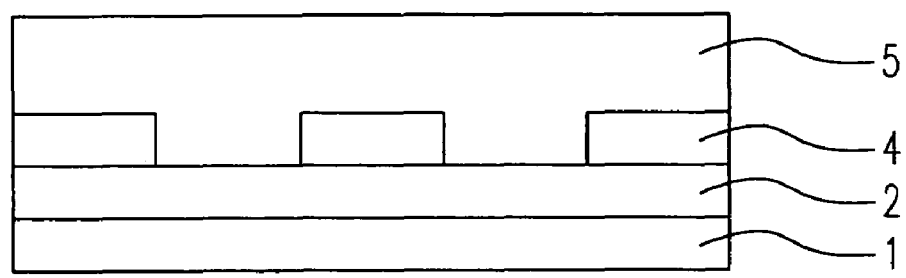

The ferroelectric BLT film was formed from the solution using a metal organic decomposition (MOD) method, wherein the first stage is performed at 1,000 rpm for 30 seconds, the second stage is performed at 4,000 rpm for 30 seconds, a soft bake is performed at 150° C. for 10 to 30 minutes and a hard bake is performed at 400° C. for 10 to 30 minutes. The foresaid steps are duplicated to form a ferroelectric layer having a thickness of 180 nm. The ferroelectric layer is annealed by a rapid thermal annealing process at 600 to 900° C. for 1 to 30 minutes to form a ferroelectric thin film 5 on the plurality of oxide electrodes (LNO) 4 as shown in FIG. 1(d).

Figure 1E:
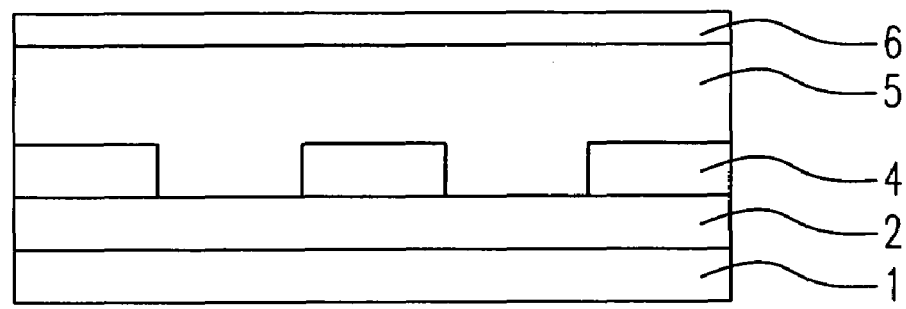
Figure 1F:
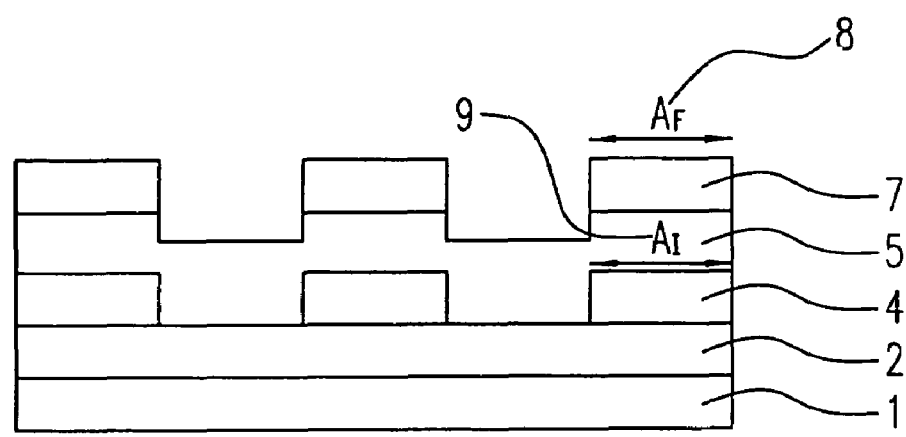

Referring to FIG. 1(e), the platinum layer 6 is deposited on the ferroelectric layer 5. Then, the platinum layer 6 is etched by a lift-off process to form a plurality of platinum electrodes 7 as shown in FIG. 1(f). Accordingly, the ferroelectric memory structure of the present invention is completely formed. The foresaid method is one of various methods for fabricating the structure. It means that the method for forming each layer is not limited to PVD, CVD or MOD. A thermal annealing process for treating each layer to crystallize each thin film and electrode is not limited to carry out in infrared or thermal furnace, but is chosen depend on the requirement and performance specifications.

Figure 2:
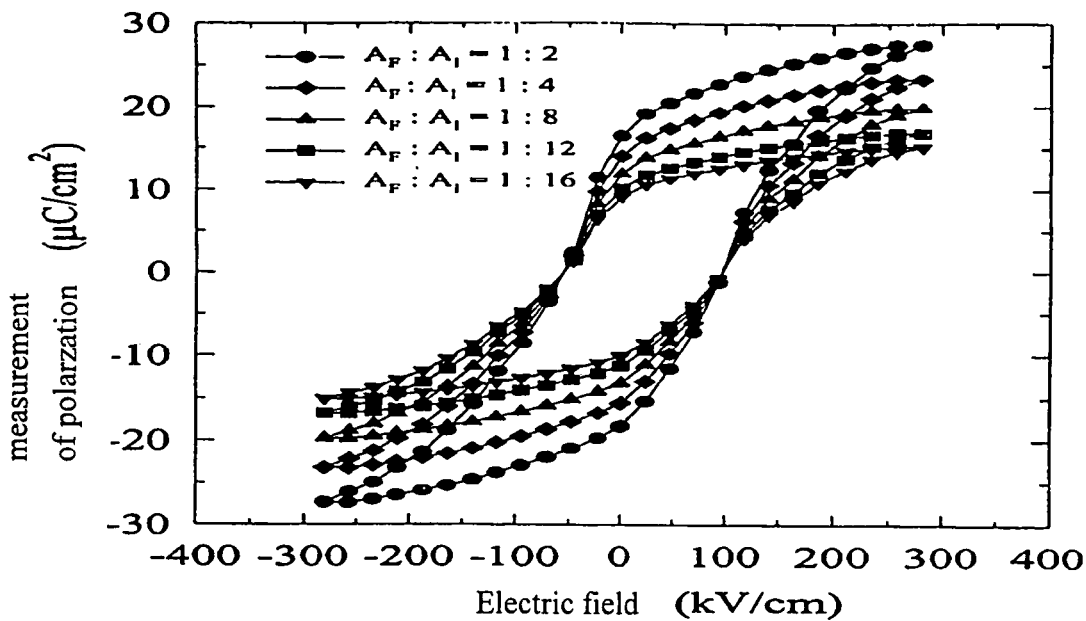
FIG. 2 is a chart showing the relationship between the polarization and the electric field according to the ferroelectric memory structure of the present invention.
Figure 3:
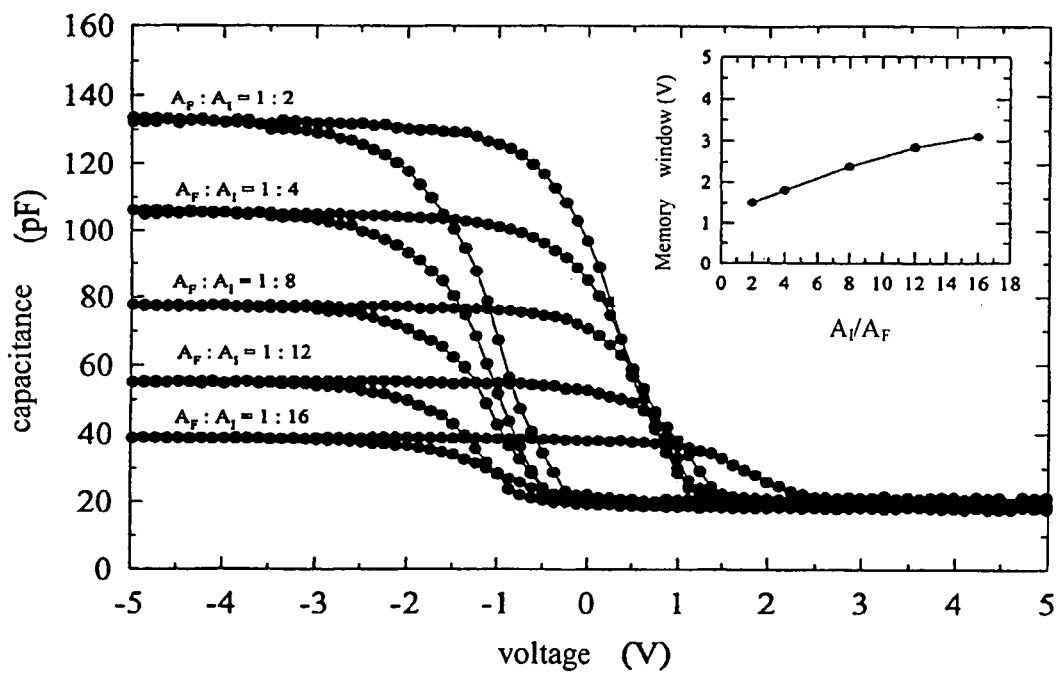
FIG. 3 is a chart showing the relationship between the memory window and $A_F/A_I$ according to the ferroelectric memory structure of the present invention.
Figure 4:
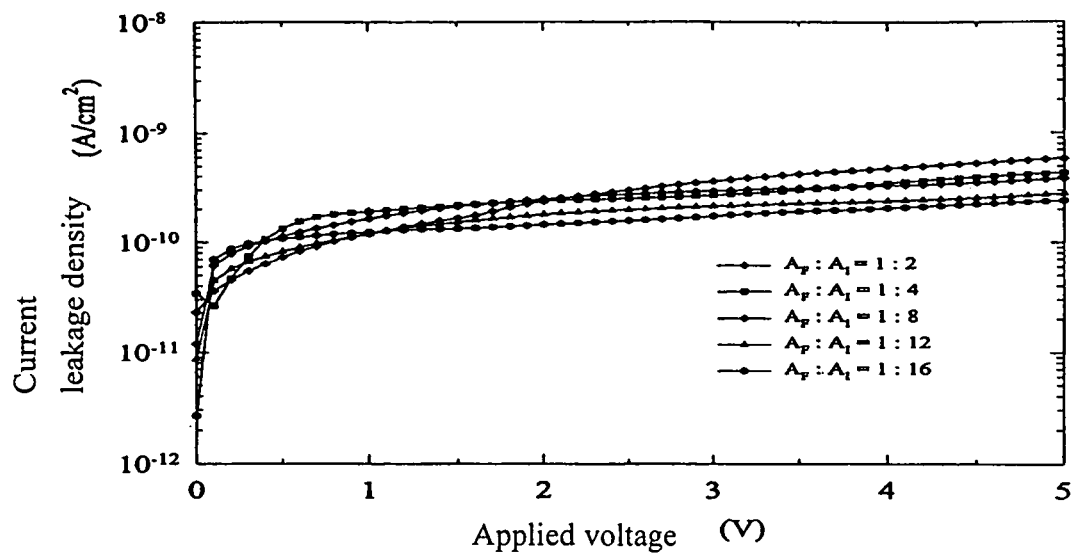
FIG. 4 is a chart showing the relationship between the current leakage density and the applied voltage according to the ferroelectric memory structure of the present invention.
Figure 5:
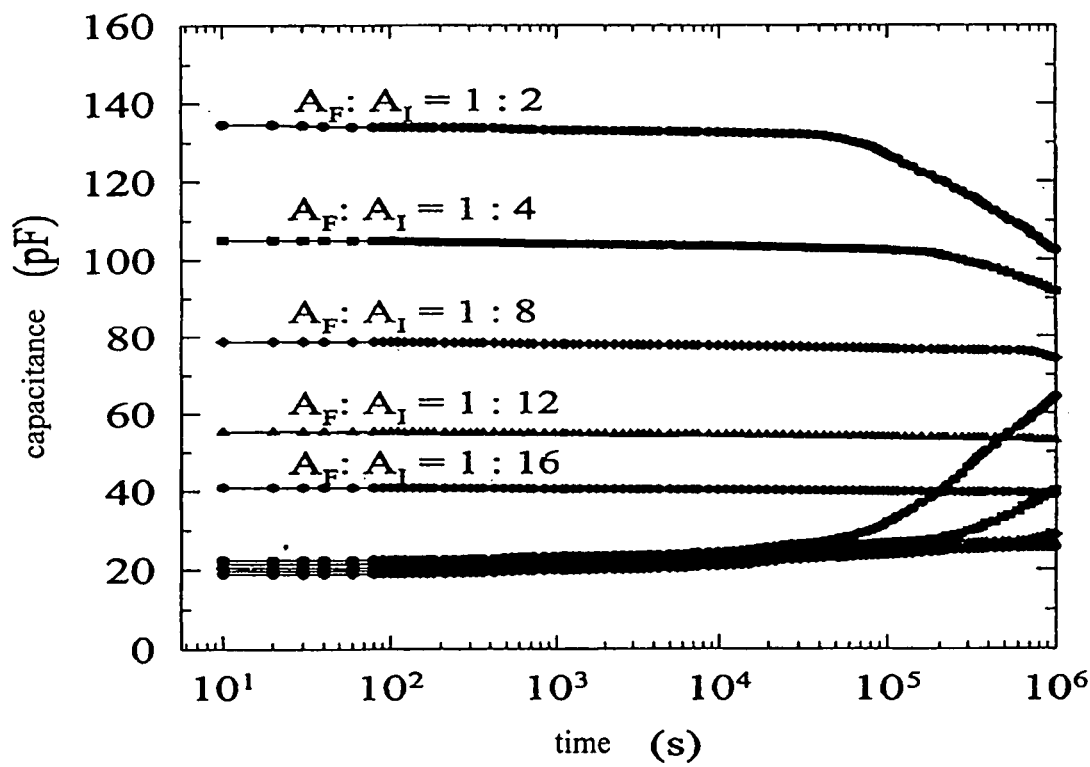
FIG. 5 is a chart showing the relationship between the capacitance and the memory retention time according to the ferroelectric memory structure of the present invention.

As foresaid description and a ferroelectric memory structure shown in FIG. 1(f), when the plurality of platinum electrodes 7 are formed by a lift-off process, the plurality of platinum electrodes 7 are regulated to respectively have a ratio of the first electrode area 8 ($A_F$) to the second electrode area 9 ($A_I$). The ferroelectric layer (BLT) 5 fabricated at low temperature has a higher ratio of remnant polarization (Pr) to saturation polarization (Ps). Referring to FIG. 2, when $A_F/A_I$ is lowered to 1/16 from 1/2, $P_r/P_s$ is raised to 0.91 from 0.67. Further, since the MgO doped BST insulating layer 2 having a high thermal stability and high dielectric constant is used, the memory window and the current leakage density respectively tend to be a desired and satisfied result when $A_F/A_I$ is lowered. Referring to FIGS. 3 and 4, when $A_F/A_I$ is decreased, the characteristics of the structure tend to be a larger memory window and a lower leakage current density. It is the most important that the better capacitance match between MFM and MIS is formed when $A_F/A_I$ is decreased. Referring to FIG. 5, when $A_F/A_I$ is less than 1/12, the memory retention time of MFMIS structure is extended up to $10^6$ seconds.

In conclusion, the present invention provides a memory ferroelectric structure to overcome the drawbacks of the prior art, and further to extend the memory retention time for more than $10^6$ seconds. The present invention can be applied to a non-volatile ferroelectric random access memory. In addition, according to the present invention, the advantages of the present invention include that the fabrication temperature of components is lowered, the interface reactions are decreased to avoid destroying the performance of the components, and the cost is decreased. Thus, the present invention not only overcomes the disadvantages of the prior art, but also exhibits the industrial application.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A ferroelectric memory structure, comprising:
   a substrate;
   an insulating layer formed on said substrate;
   a plurality of oxide electrodes formed on said insulating layer;
   a ferroelectric layer formed on said insulating layer and said plurality of oxide electrodes; and
   a plurality of metallic electrodes formed on said ferroelectric layer and corresponding to said plurality of said oxide electrodes;
   wherein said plurality of metallic electrodes respectively have a first electrode area, and said plurality of oxide electrodes respectively have a second electrode area, wherein a ratio of said first electrode area to said second electrode area is less than 1/12.

2. The ferroelectric memory structure according to claim 1, wherein said substrate is a silicon substrate.

3. The ferroelectric memory structure according to claim 2, wherein said silicon substrate is a p-type silicon substrate.

4. The ferroelectric memory structure according to claim 2, wherein said silicon substrate is a n-type silicon substrate.

5. The ferroelectric memory structure according to claim 1, wherein said insulating layer is made of $Ba_xSr_{1-x}TiO_3$, wherein the x is in a range between 0.3 and 1.

6. The ferroelectric memory structure according to claim 5, wherein said insulating layer is doped by MgO.

7. The ferroelectric memory structure according to claim 1, wherein said plurality of oxide electrodes are made of $LaNiO_3$.

8. The ferroelectric memory structure according to claim 1, wherein said ferroelectric layer is made of $Bi_xLa_{4-x}Ti_3O_{12}$, wherein x is in a range between 0 and 1.

9. The ferroelectric memory structure according to claim 1, wherein said plurality of metallic electrodes are made of one of noble metals selected from a group consisting of Pt, Ru and Ir, and an oxide electrode containing a perovskite structure and comprising one selected a group consisting of $LaNiO_3$, $SrRuO_3$, $BaRuO_3$ and $YBa_2Cu_3O_7$.

* * * * *